United States Patent
Schöniger et al.

(10) Patent No.: US 6,188,642 B1
(45) Date of Patent: Feb. 13, 2001

(54) INTEGRATED MEMORY HAVING COLUMN DECODER FOR ADDRESSING CORRESPONDING BIT LINE

(75) Inventors: Sabine Schöniger; Peter Schrögmeier; Thomas Hein, all of München; Stefan Dietrich, Türkenfeld; Thilo Marx, München, all of (DE)

(73) Assignee: Siemens Aktiengesellschaft, Munich (GB)

( * ) Notice: Under 35 U.S.C. 154(b), the term of this patent shall be extended for 0 days.

(21) Appl. No.: 09/348,736

(22) Filed: Jul. 6, 1999

(30) Foreign Application Priority Data

Jul. 6, 1998 (DE) ................................ 198 30 111

(51) Int. Cl.[7] ........................................... G11C 8/00
(52) U.S. Cl. ..................................... 365/239; 365/230.06
(58) Field of Search ........................ 365/239, 233, 365/230.06, 236, 230.08; 371/21.2

(56) References Cited

U.S. PATENT DOCUMENTS 5,629,903 * 5/1997 Agata ..................................... 365/233
5,749,086    5/1998 Ryan ..................................... 711/105
5,936,975 * 8/1999 Okamura ............................... 371/21.2
6,009,038 * 12/1999 Koshizuka ......................... 365/230.08

OTHER PUBLICATIONS

U. Tietze: "Halbleiter–Schaltungstechnik" (Electronic Circuits: Designs and Applications), Springer–Verlag Berlin, 1991, Fig. 11.9.

* cited by examiner

Primary Examiner—David Nelms
Assistant Examiner—David Lam
(74) Attorney, Agent, or Firm—Herbert L. Lerner; Laurence A. Greenberg; Werner H. Stemer

(57) ABSTRACT

The integrated memory has a column decoder for decoding column addresses and for addressing corresponding bit lines. The memory also has a first column address bus, which is used to transfer first column addresses to the column decoder, and a second column address bus, which is used to transfer second column addresses to the column decoder. The column decoder in each case addresses bit lines which correspond to the first and second column addresses supplied to it.

5 Claims, 2 Drawing Sheets

INTEGRATED MEMORY HAVING COLUMN DECODER FOR ADDRESSING CORRESPONDING BIT LINE

BACKGROUND OF THE INVENTION

1. Field of the Invention

The invention lies in the field of integrated technology. Specifically, the invention relates to an integrated memory having a column decoder for decoding column addresses and for addressing corresponding bit lines.

Such an integrated memory in the form of a DR-AM is described and illustrated, for example, by Tietze and Schenk, "Electronic Circuits: Design and Applications," FIG. 11.9, Springer-Verlag Berlin, 1991. As is generally customary, the RAM also has a row decoder for decoding row addresses and for addressing corresponding word lines. All the column addresses are supplied to the column decoder via a column address bus, while the row addresses are supplied to the row decoder via a row address bus.

SUMMARY OF THE INVENTION

It is accordingly an object of the invention to provide an integrated memory, which overcomes the above-mentioned disadvantages of the heretofore-known devices and methods of this general type and wherein the column addresses are supplied to the column decoder in another way.

With the foregoing and other objects in view there is provided, in accordance with the invention, an integrated memory, comprising:

- a plurality of bit lines;
- a column decoder connected to the bit lines for decoding column addresses and for addressing corresponding bit lines;
- a first column address bus connected to the column decoder for transferring first column addresses to the column decoder;
- a second column address bus connected to the column decoder for transferring second column addresses to the column decoder;
- the column decoder addressing bit lines according to the first and second column addresses received through the first and second column buses respectively.

In other words, the integrated memory configuration according to the invention has a column decoder for decoding column addresses and for addressing corresponding bit lines. It also has a first column address bus, which is used to transfer first column addresses to the column decoder, and a second column address bus, which is used to transfer second column addresses to the column decoder, the column decoder in each case addressing those bit lines which correspond to the first and second column addresses supplied to it.

In conventional memories, only one column address bus is provided for supplying all the column addresses. Hence, column addresses can be transferred to the column decoder only sequentially via this one column address bus. In the invention, however, the column addresses are transferred via two different column address buses.

The invention affords the advantage that temporally independent column addresses for addressing different bit lines can be transferred both via the first and via the second column address bus. Hence, for example, column addresses can be transferred to the column decoder via the first column address bus while the second column address bus is unavailable because it is required for other tasks. The invention makes it possible to reduce the time wasted on account of the signal delay times of the column addresses on the column address buses, because a column address can actually be transported to the column decoder via the first column address bus while the second column address bus is still providing a previous column address on the column decoder.

In accordance with an added feature of the invention, the first column addresses are supplied from the first column address bus to the column decoder in dependence on a first clock signal, and the second column addresses are supplied from the second column address bus to the column decoder in dependence on a second clock signal. In other words, the memory has a first clock signal, subject to which the first column addresses on the first column address bus are supplied to the column decoder, and a second clock signal, subject to which the second column addresses on the second column address bus are supplied to the column decoder. It is then possible to transport the first and second column addresses directly to the column decoder via the appropriate column address bus and then, using the first and second clock signals, to supply them at the desired instant of decoding by the column decoder. This has the advantage that long signal delay times caused by generally long address buses are no longer an issue for decoding by the column decoder if the first and the second clock signal are synchronized such that the corresponding column addresses have already been transferred to the column decoder via the address buses.

In accordance with an additional feature of the invention, there are provided:

- address inputs for receiving the first column addresses connected to the first column address bus, and an address counter connected to the address inputs;
- a control unit connected to the address inputs for loading one of the first column addresses applied to the address inputs into the address counter as a starting address thereof;
- wherein the address counter is controlled by the second clock signal; and
- wherein, for a specific number of cycles of the second clock signal, a respective content of the address counter is transferred to the second column address bus as one of the second column addresses.

The control unit thus loads one of the first column addresses applied to the address inputs into the address counter as its starting address and the address counter is controlled by the second clock signal. In addition, for a specific number of cycles of the second clock signal, the respective content of the address counter is transferred to the second column address bus as one of the second column addresses.

In this embodiment, the first column address can therefore be transferred directly from the address inputs to the column decoder via the first column address bus, and, at the same time as this is happening, this first column address can be loaded into the address counter as its starting address. This means that the column decoder is already addressing a bit line corresponding to the first column address while the first of the second column addresses is being generated by means of the address counter. With each cycle of the second clock signal, the content of the address counter is similarly supplied to the column decoder via the second column address bus, again subject to the second clock signal, whereupon the column decoder in each case addresses other bit lines corresponding to the second column addresses. This embodiment of the invention is thus suitable for implementing burst access to the bit lines of the memory, in which only one respective first column address is applied to the address inputs externally, and then a defined number of second column addresses are likewise transferred to the column decoder by means of the address counter and the second column address bus. Consequently, a number of the bit lines are always addressed in succession by the column decoder when one of the first column addresses is applied.

In accordance with another feature of the invention, the control unit for loading the starting address into the address counter is controlled by the first clock signal. In other words, the supply of the first column address to the column decoder as well as the loading of the first column address into the address counter are controlled by the first clock signal. This has the advantage that the decoding of the first column address and generation of the second column addresses take place simultaneously.

In accordance with a concomitant feature of the invention, the device includes a plurality of word lines and a row decoder for addressing the word lines; the first column address bus is also a row address bus usable, with time-division multiplexing to transfer the first column addresses, for additionally transferring row addresses from the address inputs to the row decoder for addressing the word lines; and the row addresses are supplied from the first column address bus to the row decoder in dependence on a third clock signal.

This development affords the advantage that, despite the presence of the two column address buses, dual utilization of the first column address bus as a row address bus means that the number of address buses required is no greater than in conventional memories. As mentioned in the introduction, conventional memories have a single column address bus and a row address bus which is separate from this, that is to say two address buses in all.

In the case of the invention, the third clock signal makes it possible to distinguish between column addresses which are situated on the first column address bus and are to be supplied to the column decoder subject to the first clock signal, and row addresses which are situated on the first column address bus and are to be supplied to the row decoder subject to the third clock signal.

Other features which are considered as characteristic for the invention are set forth in the appended claims.

Although the invention is illustrated and described herein as embodied in an integrated memory, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
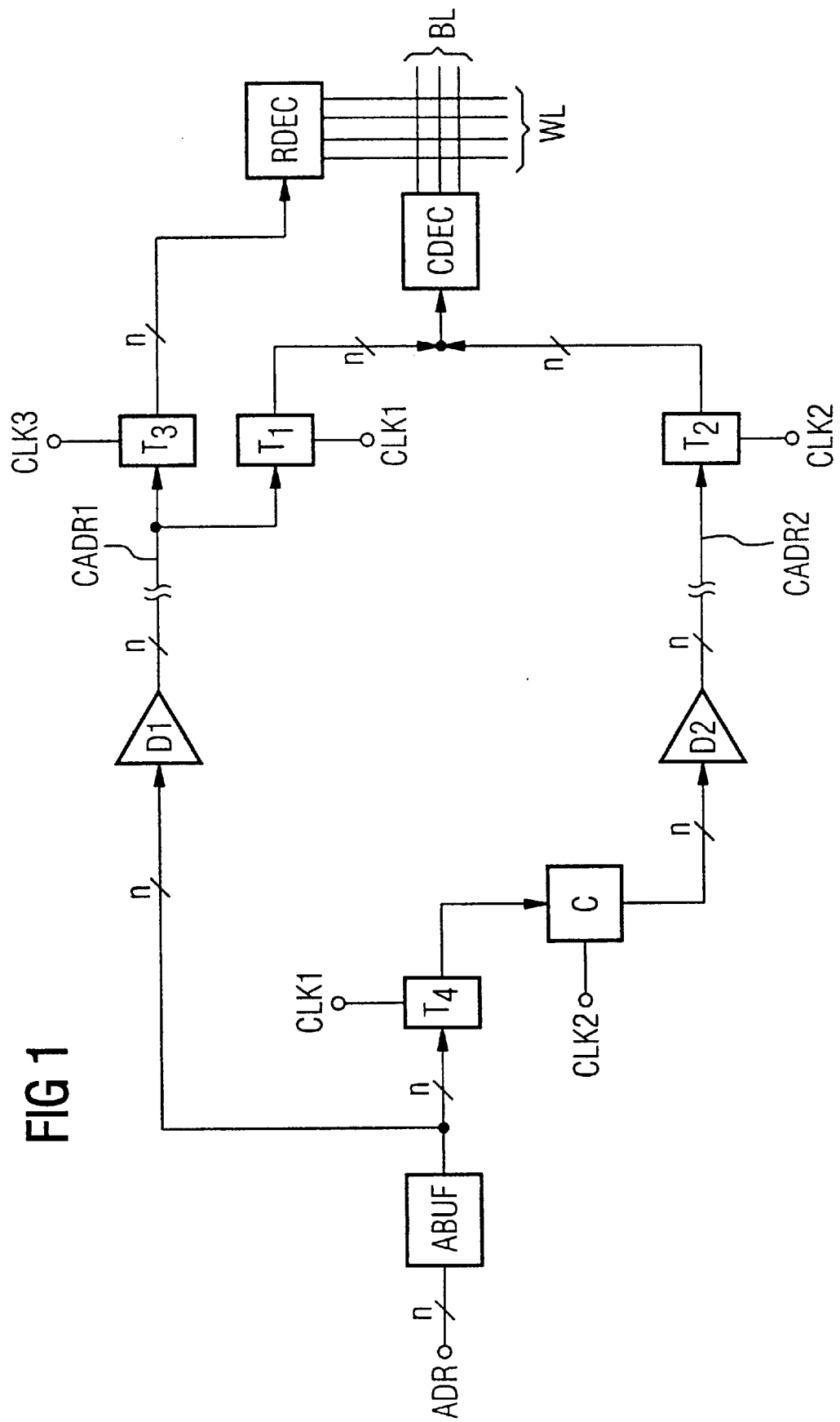
FIG. 1 is a schematic diagram of an exemplary embodiment of the integrated memory according to the invention.

Referring now to the figures of the drawing in detail and first, particularly, to FIG. 1 thereof, there is seen a DRAM 1 representing the integrated memory according to the invention. It will be understood, however, that the invention is not restricted to DRAMs but can also be applied to all other types of memories in which column lines are addressed using column addresses. The DRAM has memory cells arranged in the form of a matrix along bit lines BL and word lines WL. The bit lines can be addressed using a column decoder CDEC and the word lines can be addressed using a row decoder REEC. To address the bit lines, corresponding column addresses are supplied to the column decoder CDEC. Similarly, to address the word lines, corresponding row addresses are supplied to the row decoder RDEC. In this respect, the DRAM is no different than conventional memories. The essential feature of the invention is that, in contrast to conventional memories, the column addresses are supplied to the column decoder CDEC via two different column address buses, specifically via a first column address bus CADR1 and a second column address bus CADR2. In this context, the column addresses situated on the first column address bus CADR1 are supplied to the column decoder CDEC via a first transfer gate T1, which is clocked with a first clock signal CLK1, and the column addresses situated on the second column address bus CADR2 are supplied to the column decoder CDEC via a second transfer gate T2, which is clocked with a second clock signal CLK2.

In other exemplary embodiments of the invention, both the first and the second column address bus can be supplied with column addresses which are each applied to the memory externally. In the exemplary embodiment shown in FIG. 1, however, this is not the case. The memory has address inputs ADR which are used to supply externally applied column addresses to an address buffer ABUF, where they are stored temporarily. These column addresses applied to the memory externally will be called first column addresses below. On the one hand, the first column address is transferred from the address buffer ABUF via a driver D and the first column address bus CADR1, connected downstream thereof, to the first transfer gate T1, which is clocked with the first clock signal CLK1 and is connected directly upstream of the column decoder CDEC. On the other hand, the first column address is simultaneously transferred via a fourth transfer gate T4, which is likewise clocked with the first clock signal CLK1, to the register of an address counter C, where it forms a starting address for the counter. The counter C is itself clocked with the second clock signal CLK2. With each cycle of the second clock signal CLK2, the counter increases its counter reading and supplies a corresponding newly calculated second column address at its output. This second column address, newly produced with each clock cycle of the second clock signal, is transferred via a driver D and the second column address bus CADR2, connected downstream thereof, to the second transfer gate T2, which is connected upstream of the column decoder CDEC and is clocked with the second clock signal.

By virtue of components which are not shown in further detail, the address counter C can be stopped after a predetermined number of clock cycles of the second clock signal CLK2 and can be prepared to receive a new first column address as the starting address. In the manner described, the bit lines BL of the memory can be accessed in burst mole, in which only a single first column address is applied to the address inputs ADR and then a predetermined number of bit lines BL are automatically addressed in chronological succession. This is done, on the one hand, by the applied first column address being supplied to the column decoder CDEC directly via the first column address bus CADR1, and, on the other hand, by the second column addresses, which are generated by the address counter C, being transferred to the column decoder CDEC via the second column address bus CADR2.

The arrangement of the first transfer gate T1 at the end of the first column address bus CADR1 directly upstream of the column decoder CDEC means that the first column address, driven by the first driver D1 via the first column address bus CADR1, now requires only a negligible signal delay time for the distance from the first transfer gate T1 to the column decoder CDEC. With current integrated memory sizes, on the other hand, the address inputs ADR are a very long way from the column decoders, so that the column address buses are very long, which is associated with considerable signal delay times.

Whereas, in other exemplary embodiments of the invention, it is possible to supply the row addresses to the row decoder RDEC via a separate row address bus, which means that a total of three address buses (namely two column address buses and a row address bus) are required, the exemplary embodiment shown in FIG. 1 advantageously has only two address buses in all (namely the two column address buses CADR1 and CADR2). This is because, as shown in FIG. 1, the row addresses are likewise transferred via the first column address bus CADR1. The address inputs ADR can thus (using time-division multiplexing) have not only first column addresses applied to them, but also row addresses, which are transferred via the address buffer ABUF and the first driver DI as well as the first column address bus CADR1, connected downstream of the latter, to a third transfer gate T3, which is clocked with a third clock signal CLK3. From the third transfer gate T3, the row addresses are transferred to the row decoder RDFC subject to the third clock signal CLK3. Since the first transfer gate T1 is clocked with the first clock signal CLK1 and the third transfer gate T3 is clocked with the third clock signal CLK3, it is possible to use said clock signals to distinguish whether the addresses situated on the first column address bus CADR1 are being handled as a first column address or as a row address.

FIG. 1 also shows that there are n address inputs ADR and that the column address buses CADR1, CADR2 also have a length of n bits. Hence, both first column addresses and second column addresses with a length of n bits can be transferred. Furthermore, in the exemplary embodiment shown, the row addresses also have a length of n bits. In other embodiments of the invention, it is naturally also possible for the first column address bus CADR1 to have a greater bit length than the second column address bus CADR2. This is the case, for example, if the row addresses have a greater bit length than the column addresses. The first column address bus CADR1 must then have the greater length of the row addresses. For transferring the first column addresses via the first column address bus CADR1, not all of its lines are then required.

Figure 2:
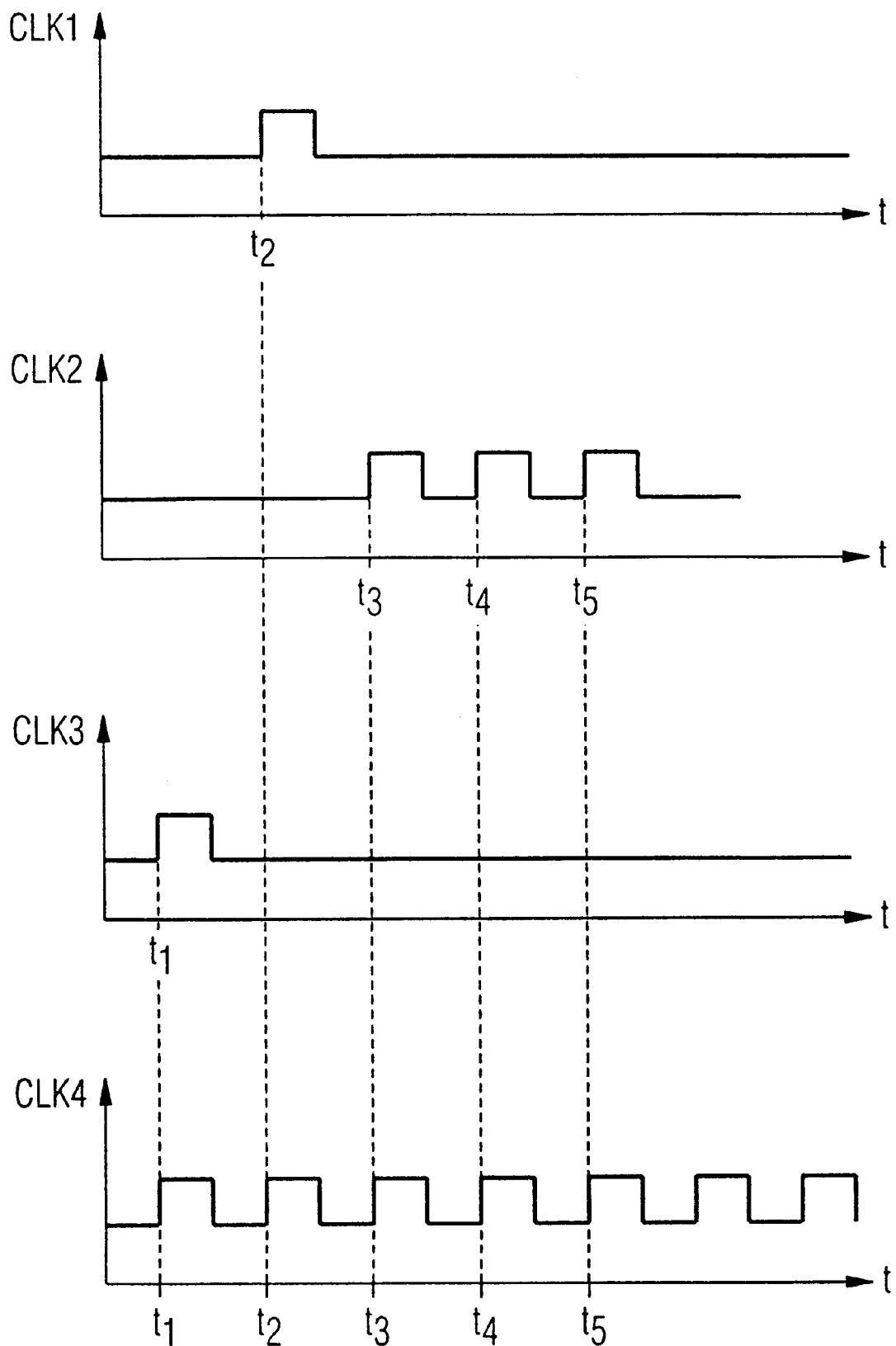
FIG. 2 is a set of graphs of clock signals for the exemplary embodiment shown in FIG. 1.

Referring now to FIG. 2, there is shown, by way of example, the waveforms for the first to third clock signals CLK1 to CLK3, which are derived from a fourth clock signal CLK4, which is supplied to the integrated memory externally, for example, and has a constant clock period. For the clock signals CLK1 to CLK3 shown in FIG. 2, it is assumed that the corresponding transfer gate T1 to T4 (in FIG. 1) that they control is always on when the respective clock signal is at a high level, and is always off at a low level. The following text describes an addressing procedure for write or read access to the memory.

At a first instant t1, the third clock signal CLK3 in FIG. 2 is briefly at a high level, so that a row address applied to the address inputs ADR at this instant is transferred to the row decoder RDEC via the first column address bus CADR1 and the third transfer gate T3. The row decoder then activates the corresponding word line. At a second instant t2, the first clock signal CLK1 is briefly at a high level, so that a first column address which is applied to the address inputs ADR at this instant and is applied to the first transfer gate T1 via the first column address bus CADR1 is transferred to the column decoder CDEC via said transfer gate T1. Said column decoder CDEC addresses a corresponding bit line. At the same time as the first column address is being transferred to the column decoder via the first transfer gate T1, the first column address is loaded into the address counter C via the fourth transfer gate T4, which is likewise clocked with the first clock signal CLK1. At further instants t3, t4, t5, the second clock signal CLK2 is briefly at a high level, which means that the starting address stored in the address counter C is incremented each time. With each cycle of the second clock signal CLK2, the counter reading of the address counter C is transferred to the second transfer gate T2 via the second column address bus CADR2. From there, it is transferred to the column decoder CDEC as a second column address, likewise subject to the second clock signal CLK2.

Right after the first clock signal CLK1 is at the high level, which occurs at the second instant t2, the output of the address counter C advantageously supplies a second column address, which is greater than the first column address by the predetermined increment. Before the first pulse of the second clock signal CLK2 actually occurs, this second column address can then be transferred to the second transfer gate T2. With the pulse, occurring at the instant t3, of the second clock signal CLK2, the very first of the second column addresses can then be transferred directly from the input of the second transfer gate T2 to the column decoder CDEC. This means that the delay time of the second column address on the second column address bus CADR2 occurs while the first column address is still being decoded by the column decoder CDEC. The second column addresses, supplied to the column decoder CDEC with each subsequent clock cycle of the second clock signal CLK2, are likewise decoded by said column decoder CDEC and cause respectively corresponding bit lines BL to be addressed.

Since the word line WL addressed initially at the instant t1 by the row decoder RDEC remains activated for the whole time, subsequently supplying the first column address and the second column addresses to the column decoder CDEC means that a respective data item can be read from (Dr written to the memory in the manner described.

The outlined exemplary embodiment of FIG. 1 is suitable for use in those memories in which the row addresses and the first column addresses are supplied to the address inputs ADR in succession. Since the second column addresses are then automatically generated within the memory from the first column address by means of the address counter C, the first column address bus CADR1 can be used, actually in parallel with this, to supply a new row address (applied to the address inputs ADR) to the third transfer gate T3 via the first column address bus CADR1. This means that, when the address cycle explained with reference to FIG. 2 begins again, the next row address, which is to be supplied by means of the third clock signal CLK3, is actually provided early at the third transfer gate T3, so that signal delay times on the first column address bus CADR1 are no longer an issue in the subsequent step of decoding the row address.

The exemplary embodiment outlined directly above is advantageously suitable for use in integrated memories which have a relatively large number of memory blocks or memory banks, each of which is organized as shown in the right-hand part of FIG. 1. That is to say that each block has a column decoder, a row decoder and control circuits equivalent to the first to third transfer gates T1, T2, T3 in FIG. 1. In this arrangement, the transfer gates T1, T2, T3 for the different banks are all connected to the same first and the same second column address bus.

The fact that the three control circuits are driven with different control signals means that this memory can be operated in so-called multi-bank mode, in which one bank is activated and the other banks are deactivated in each case. In this context, "deactivated bank" then means a bank in which, although the row decoder can be used to activate word lines, no bit lines in this bank can be selected using the column decoder. In such a memory, the first column address bus CADR1 can be used, as early as during a column address burst currently being carried out in the respectively activated memory bank, to supply one of the deactivated banks with a new row address for a new column address burst to be carried out subsequently. The new row address can then actually be decoded and the corresponding word line activated in the latter-mentioned bank, while in the currently active bank the second column addresses are still being generated, transferred via the second column address bus and decoded. Only at the end of its burst access is the first bank deactivated and the second bank activated, whereupon the desired burst access is started in the second bank by supplying a new first column address.

The outlined procedure produces a speed advantage because new row addresses are actually provided very early at the corresponding row decoders and are decoded before the end of the previous burst access to another bank. During a change of bank, it is then immediately possible to start supplying the first column address because the associated row address has been decoded even before the change of bank (change of active bank).

We claim:

1. An integrated memory, comprising:
    a column decoder for decoding column addresses and for addressing corresponding bit lines;
    a first column address bus connected to said column decoder for transferring first column addresses to said column decoder;
    a second column address bus connected to said column decoder for transferring second column addresses to said column decoder;
    address input lines for receiving the first column addresses, said address input lines connected to said first column address bus for supplying the first column addresses thereto;
    an address counter for storing and incrementing a starting address to obtain the second column addresses, said address counter connected to said second column address bus for supplying the second column addresses thereto during a specific number of clock cycles of a clock signal applied to said address counter; and
    a control unit connected to said address input lines and to said address counter for loading one of the first column addresses into said address counter as the starting address;
    said column decoder for addressing bit lines according to the first and second column addresses received through said first and second column buses respectively.

2. The memory according to claim 1, wherein the clock signal defines a second clock signal, the first column addresses are supplied from said first column address bus to said column decoder in dependence on a first clock signal, and the second column addresses are supplied from said second column address bus to said column decoder in dependence on the second clock signal.

3. The memory according to claim 2,
    wherein said address counter is controlled by the second clock signal.

4. The memory according to claim 3, wherein said control unit for loading the starting address into said address counter is controlled by the first clock signal.

5. The memory according to claim 4, which further comprises a plurality of word lines and a row decoder for addressing said word lines;
    wherein said first column address bus is also a row address bus usable, with time-division multiplexing to transfer the first column addresses, for additionally transferring row addresses from said address inputs to said row decoder for addressing said word lines; and
    wherein the row addresses are supplied from said first column address bus to said row decoder in dependence on a third clock signal.

* * * * *